(12) United States Patent
Koutsaroff et al.

(10) Patent No.: US 8,883,606 B2
(45) Date of Patent: *Nov. 11, 2014

(54) MULTI-LEVEL THIN FILM CAPACITOR ON A CERAMIC SUBSTRATE AND METHOD OF MANUFACTURING THE SAME

(71) Applicant: BlackBerry Limited, Waterloo (CA)

(72) Inventors: Ivoyl P. Koutsaroff, Hamilton (CA); Mark Vandermeulen, Burlington (CA); Andrew Vladimir Claude Cervin, Oakville (CA); Atin J. Patel, Mississauga (CA)

(73) Assignee: BlackBerry Limited, Waterloo, ON (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/035,195

(22) Filed: Sep. 24, 2013

(65) Prior Publication Data

US 2014/0037835 A1    Feb. 6, 2014

Related U.S. Application Data

(60) Continuation of application No. 11/736,408, filed on Apr. 17, 2007, now Pat. No. 8,569,142, which is a division of application No. 10/997,344, filed on Nov. 24, 2004, now Pat. No. 7,224,040.

(60) Provisional application No. 60/525,897, filed on Nov. 28, 2003.

(51) Int. Cl.
| | |
|---|---|
| *H01L 21/20* | (2006.01) |
| *H05K 1/16* | (2006.01) |
| *H01G 4/38* | (2006.01) |
| *H01L 27/01* | (2006.01) |
| *H01G 4/33* | (2006.01) |
| *H01G 13/04* | (2006.01) |
| *H05K 3/38* | (2006.01) |
| *H05K 1/03* | (2006.01) |

(52) U.S. Cl.
CPC .. *H01G 4/38* (2013.01); *H05K 3/38* (2013.01); *H05K 1/0306* (2013.01); *H05K 1/162* (2013.01); *H05K 2201/0179* (2013.01); *H05K 3/388* (2013.01); *H01L 27/016* (2013.01); *H01G 4/33* (2013.01); *H01G 13/04* (2013.01); *H05K 2201/0175* (2013.01)
USPC ........... 438/396; 438/210; 438/239; 438/253; 257/535

(58) Field of Classification Search
CPC ................................ H01G 4/38; H01G 13/04
USPC ....................... 427/79; 438/396; 257/535, 295
See application file for complete search history.

(56) References Cited

U.S. PATENT DOCUMENTS

| | | |
|---|---|---|
| 4,221,047 A | 9/1980 | Narken et al. |
| 5,034,850 A | 7/1991 | Hernandez |
| 5,110,712 A | 5/1992 | Kessler |

(Continued)

OTHER PUBLICATIONS

Quick, et al., "Semiconductor Manufacturing Technology", Prentice Hall, Copy Right 2001; ISBN:0-13-081520-9, 214-219, 227-228, 302-307.

*Primary Examiner* — Caleb Henry

(74) *Attorney, Agent, or Firm* — Guntin & Gust, PLC; Andrew Gust

(57) ABSTRACT

In accordance with the teachings described herein, a multi-level thin film capacitor on a ceramic substrate and method of manufacturing the same are provided. The multi-level thin film capacitor (MLC) may include at least one high permittivity dielectric layer between at least two electrode layers, the electrode layers being formed from a conductive thin film material. A buffer layer may be included between the ceramic substrate and the thin film MLC. The buffer layer may have a smooth surface with a surface roughness (Ra) less than or equal to 0.08 micrometers (um).

19 Claims, 8 Drawing Sheets

(56) References Cited

U.S. PATENT DOCUMENTS

| | | |
|---|---|---|
| 5,162,742 A | 11/1992 | Atkins |
| 5,177,670 A | 1/1993 | Shinohara |
| 5,206,788 A | 4/1993 | Larson |
| 5,593,914 A | 1/1997 | Evans |
| 5,912,044 A | 6/1999 | Farooq |
| 6,115,233 A | 9/2000 | Seliskar |
| 6,531,378 B2 | 3/2003 | Hopfner |
| 6,534,358 B2 | 3/2003 | Nakura |
| 6,667,072 B2 | 12/2003 | Shuy |
| 6,727,535 B1 | 4/2004 | Sengupta |
| 6,757,152 B2 | 6/2004 | Galvagni |
| 7,335,972 B2 | 2/2008 | Chanchani |
| 2003/0020173 A1 | 1/2003 | Huff |
| 2003/0060008 A1 | 3/2003 | Hong |

MULTI-LEVEL THIN FILM CAPACITOR ON A CERAMIC SUBSTRATE AND METHOD OF MANUFACTURING THE SAME

CROSS-REFERENCE TO RELATED APPLICATIONS

This application is a continuation of U.S. patent application Ser. No. 11/736,408 filed Apr. 17, 2007, which is a divisional of U.S. patent application Ser. No. 10/997,334, filed Nov. 24, 2004, which issued as U.S. Pat. No. 7,224,040, which claims priority to U.S. Provisional Patent Application No. 60/525,897, filed Nov. 28, 2003, which are incorporated herein by reference in their entirety.

FIELD OF THE DISCLOSURE

The technology described in this patent document relates generally to the field of thin film devices and fabrication. More particularly, the patent document describes a multi-level thin-film capacitor fabricated on a ceramic substrate and a method of manufacturing the same.

BACKGROUND OF THE DISCLOSURE

Thin film circuit packages are commonly used in space-constrained applications, such as hearing instrument products. In accordance with the teachings described herein, a multi-level thin film capacitor on a ceramic substrate and method of manufacturing the same are provided.

DETAILED DESCRIPTION OF THE DRAWINGS

Figure 1:
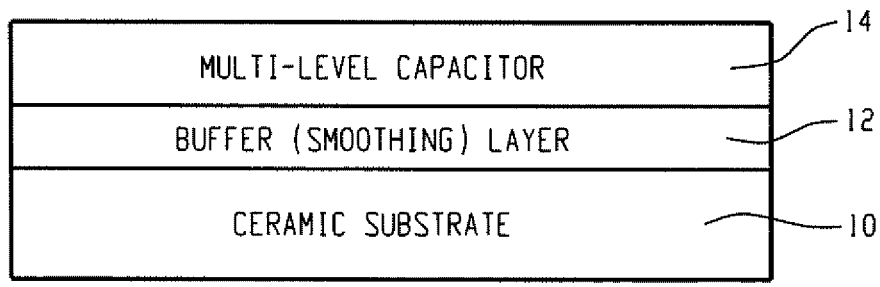
FIG. 1 is a diagram of an example multi-level thin film capacitor fabricated on a ceramic substrate.

FIG. 1 is a diagram of an example multi-level thin film capacitor 14 fabricated on a ceramic substrate 10. Also illustrated in FIG. 1 is a buffer (smoothing) layer 12 fabricated between the ceramic substrate 10 and the multi-level capacitor (MLC) 14. A thin film MLC includes one or more layers of high permittivity dielectric material (e.g., compounds containing Barium Strontium Titanium Oxide (Ba, Sr)TiO3, (BST)) deposited between electrode layers formed from a conductive thin film material (e.g., Pt, conductive oxides like, SrRuO3, LaNiO3, LaMn$_{1-x}$Co$_x$O3, etc., other metals, like Au, Cu, W, etc.). The MLC 14 can be fabricated with a variety of capacitance-voltage characteristics depending on the material properties and processing conditions of the whole stack. The MLC 14 may include a voltage variable (tunable) capacitor(s) and/or a fixed value capacitor(s), depending on the type of dielectric material used for the dielectric layer(s). The MLC 14 may be a mesa-structure formed using photolithography patterning techniques (see, e.g., FIG. 4). The fabrication of a high value thin film capacitor (e.g., with an overall capacitance density from 10 to 390 fF/μ$^2$) requires a high degree of precision, which typically cannot be achieved on a rough substrate material such as ceramic. A smooth surface sufficient for fabricating the MLC 14 is provided by the buffer layer 12.

The buffer layer 12 is a dielectric material that electrically isolates the thin film capacitor 14 and provides a smooth surface which is suitable for fabricating a thin film MLC 14. For example, the buffer layer 12 may be a thick film dielectric material that is polished to provide a smooth upper surface (see, e.g., FIG. 7). In another example, the buffer layer 12 may be a smooth (fire polished) glass dielectric material (see, e.g., FIG. 8). In the case of a polished thick film buffer layer (e.g., FIG. 7), the surface roughness (Ra) of the smooth upper surface may be less than or equal to 0.08 micrometers (μm), but is preferably less than or equal to 0.06 μm. In the case of a glass dielectric buffer layer (e.g., FIG. 8), the surface roughness (Ra) of the smooth upper surface may be less than or equal to 0.08 um, but is preferably less than or equal to 0.03 μm. In addition to providing a low surface roughness (e.g., Ra.ltoreq.0.08 μm), the buffer layer 12 is substantially free of micropores and is thus stable at high temperatures. For example, the buffer layer 12 may be able to withstand multiple anneals at high temperatures (e.g., 600-800° C.) in an oxidizing atmosphere without substantially affecting its surface quality or the resistivity of any metal filled vias. As a result, the high-k ferroelectric layer(s) of the MLC 14 may be deposited using a simple spin-coat technology, as well as methods such as Physical Vapor Deposition (PVD) or Chemical Vapor Deposition (CVD).

The ceramic substrate 10 may, for example, be Al$_2$O$_3$, AlN, MgTiO$_3$, Mg$_2$SiO$_4$ or some other ceramic substrate material. Ceramic substrate materials are typically inexpensive and are highly machinable. The ceramic substrate 10 may therefore include fine-pitched metal filled through holes that provide low and controlled parasitics (see, e.g., FIG. 4). In addition, a ceramic substrate material provides substantially better Q-factors for other passive components (e.g. thin film inductors) than conventional silicon-based substrates.

Figure 2:
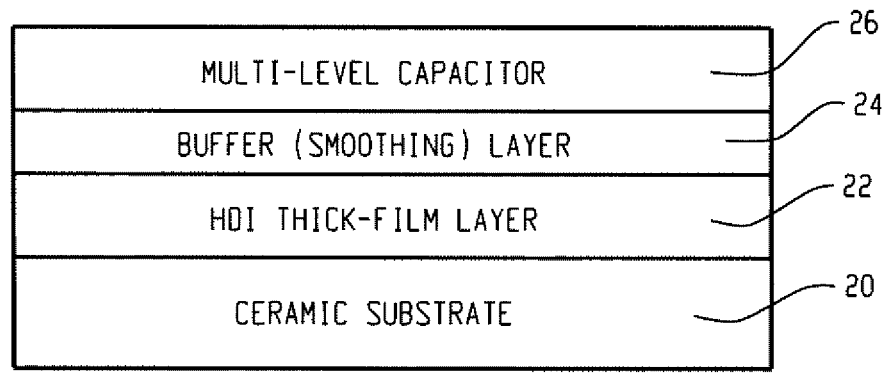
FIG. 2 is a diagram of an example multi-level thin film capacitor fabricated on a ceramic substrate including a high density interconnect (HDI) layer.

FIG. 2 is a diagram of an example multi-level thin film capacitor 26 fabricated on a ceramic substrate 20 including a HDI layer 22. The HDI layer 22 is fabricated on the ceramic substrate using thick film materials and photolithography patterning techniques to create one or more layers of high density routing (i.e., metallic traces) and filled through holes (vias). In addition, the HDI layer 22 may include buried resistors and/or capacitors. The HDI layer 24 may, for example, he used to provide substrate level interconnect and electrical connections from the top to the bottom side of the substrate. The use of a low cost and high density thick film based interconnect layer is enabled by the use of a ceramic substrate material.

Figure 3:
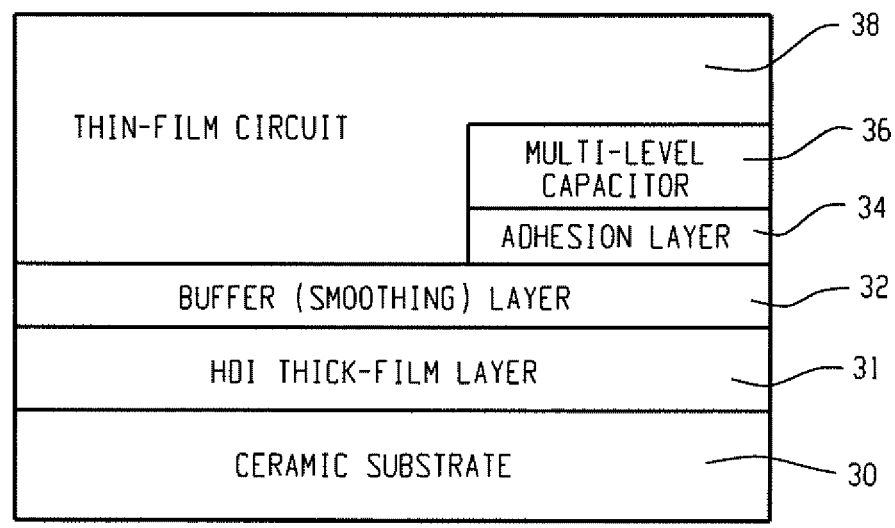
FIG. 3 is a diagram of an example multi-level thin film capacitor fabricated on a ceramic substrate and integrated with a thin film circuit.

FIG. 3 is a diagram of an example multi-level thin film capacitor 36 fabricated on a ceramic substrate 30 and integrated with a thin film circuit 38. The MLC 36 may be interconnected in a thin film circuit 38 with other passive thin film circuit elements, such as decoupling capacitors, inductors, resistors, etc. Also illustrated in FIG. 3 is an adhesion layer 34 between the buffer layer 32 and the MLC 36. The adhesion layer 34 may be included to adhere the bottom electrode layer of the MLC 36 to the smooth surface of the buffer layer 34. The adhesion layer 34 may, for example, include one or more layers of thin film TiOx and/or Al$_2$O$_3$.

Figure 4:
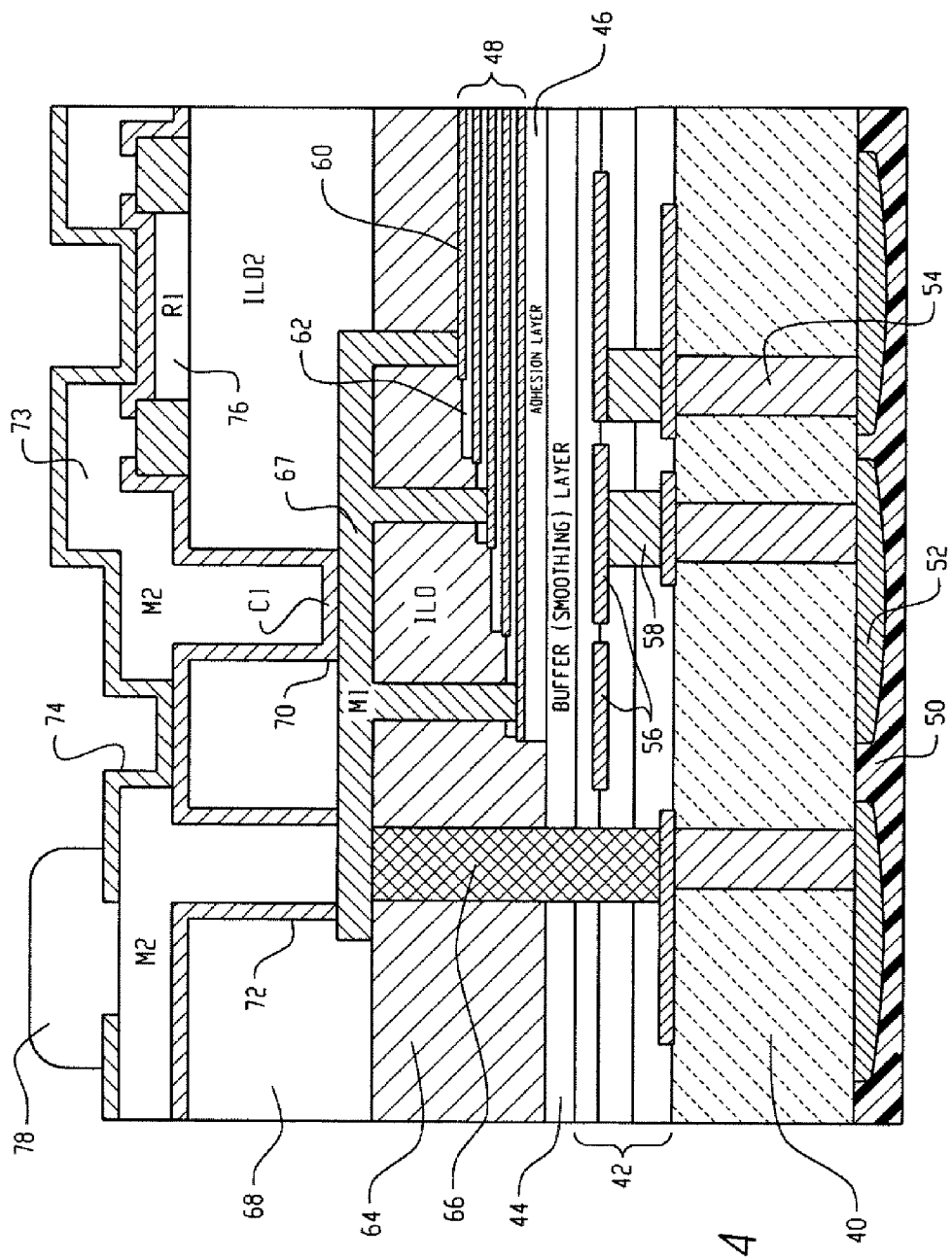
FIG. 4 is a diagram of an example capacitor network integrating a thin film circuit including a high density multi-level thin film capacitor and a low density capacitor on a ceramic substrate with a high density thick film interconnect.

FIG. 4 is a diagram of an example capacitor network integrating a thin film circuit including a high density thin film MLC 48 and a low density capacitor (C1) on a ceramic substrate 40 with a high density thick film interconnect 42. This circuit structure may, for example, be used in a system-on-a-package (SoP) structure for hearing instrument products or other products requiring high volumetric density for capacitors and other integrated passives (e.g., inductors, resistors) in radio frequency (RF), Bluetooth, and high-speed wireless (e.g., wideband) communication modules.

The ceramic substrate 40 is a machinable ceramic material, such as $Al_2O_3$. Metal filled (e.g., Ni, Ag, Ag—Pd, W, etc.) though holes 54 are machined through the substrate 40 (e.g., laser drilled or green tape punched) to provide front to back electrical connections. As noted above, the machinable nature of ceramic enables the through holes 54 to be machined in a high density pattern. Bonding pads 52 on the bottom surface of the substrate 40 provide an electrical connection to the vias 54. The bonding pads 52 may be fabricated using copper, low temperature Ag, or some other suitable conductive material. The bottom surface of the substrate may be covered by a protective coating material 50, such as $Si_3N_4$.

The high density thick film interconnect layers 42 are fabricated on the upper surface of the ceramic substrate 40, and provide substrate level routing and electrical connections between the thin film circuit and the bonding pads 52. Routing layers 56 and metal filled vias 58 in the HDI layers (stack) 42 may be fabricated using a photodefineable thick film dielectric material with high density conductive routing layers 56 (e.g. Au) or high temperature fired conductive materials (e.g., W, Mo. etc.). In addition, the HDI layers 42 may include buried resistors and inductors.

The buffer (smoothing) layer 44 is fabricated over the HDI interconnect layers 42 to provide a smooth surface for the MLC 48, as described above. The buffer layer 44 also provides a moisture barrier and additional electrical isolation between the HDI layers 42 and the thin film circuit layers. In addition, the buffer layer 44 may help to prevent out diffusion of any volatile ions that could influence the electrical performance of the MLCs 48, and prevent oxidation of the conductive material in the contact holes 66 during high temperature processing of the ferroelectric thin films in the stack 48. The buffer layer 44 may, for example, be fabricated using a polished thick film material or by depositing a layer of fritted glass material with subsequent firing at high temperatures (fire polished), as described below with reference to FIGS. 7 and 8. As illustrated, the buffer layer 44 may also include conductive material in the contact holes 66 to electrically connect the thin film circuit layers, including the MLC 48, with the HDI layer 42.

The MLC structure 48 is attached to the buffer layer 44 with an adhesion layer 46, such as TiOx and/or $Al_2O_3$. The illustrated example includes a four layer capacitor formed by depositing a BST dielectric material 62 sandwiched between conductive (e.g., Pt) electrode layers 60. Each of the four layers of the MLC structure 48 can have different properties and functions which may include different capacitance-voltage characteristics (tunabilities). The MLC structure 48 is a mesa-structure, which may be fabricated using photolithography based patterning techniques, as described below with reference to FIGS. 9A and 9B. Preferably, the capacitor formed from the top two conductive electrode layers 60 and the top-most dielectric layer 62 is a voltage variable (tunable) capacitor.

A first interlayer dielectric (ILD) 64 is fabricated over the MLC 48 and buffer layer 44. The dielectric 64 may, for example, be phosphosilicate glass (PSG) or some other suitable dielectric material. Contact holes 66 are etched in the first ILD 64, the buffer layer 44 and HDI interconnect layer stack 42 and filled with metal to provide an interconnect by contacting metal interconnect layer (M1) 67 to select electrode layers of the MLC 48 and to metal filled through holes 54. The interconnect layer (M1) 67 may, for example, be TiW/Al/TiW, TiW/Al, TiW/Pt/Au or TiW/Cu.

A second interlayer dielectric (ILD2) 68 is fabricated over the first ILD 64 and the interconnect (M1) 67. The ILD2 68 may, for example be PSG or some other suitable dielectric material, and includes metal filled vias 72 that provide a second interconnect (M2). The second interconnect layer (M2) 73 may, for example, be TiW/Au or TiW/Cu. In addition, the vias 72 may be coated with a nitride layer 70 prior to metalization in order to create one or more nitride capacitors (e.g., $Si_3Ni_4$) (C1). The illustrated nitride capacitor (C1) is formed by depositing a nitride layer 70 between the two metal interconnect layers 67, 73 (M1 and M2).

Also illustrated is a thin film resistive layer 76 (R1) that is deposited over the second interlayer dielectric and is electrically connected in series with the nitride capacitor (C1) via the second interconnect (M2). The second interconnect 73 (M2) is covered with a protective coating 74 (e.g., $Si_3N_4$), and is connected to a front metal bump layer 78 (e.g., TiW/Au). The front metal bump layer 78 may, for example, be used to electrically connect the structure to an integrated circuit (IC) chip to form a system-on-a-package (SoP) structure.

Figure 5:
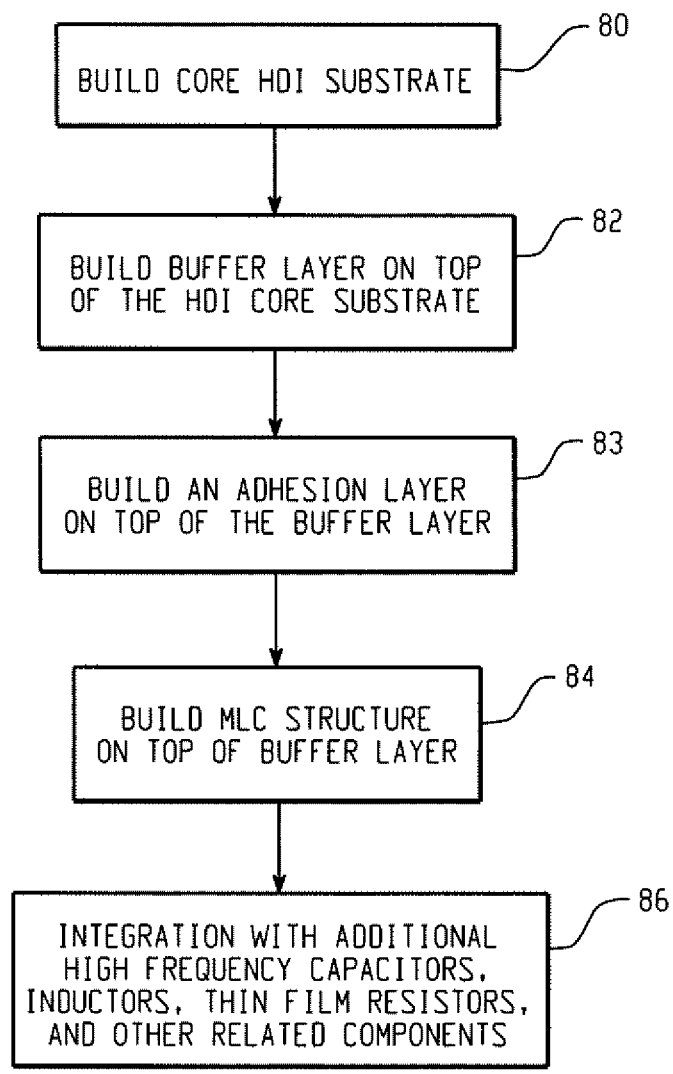
FIGS. 5-9 illustrate example processes for fabricating the circuit structure of FIG. 4.
Figure 6:
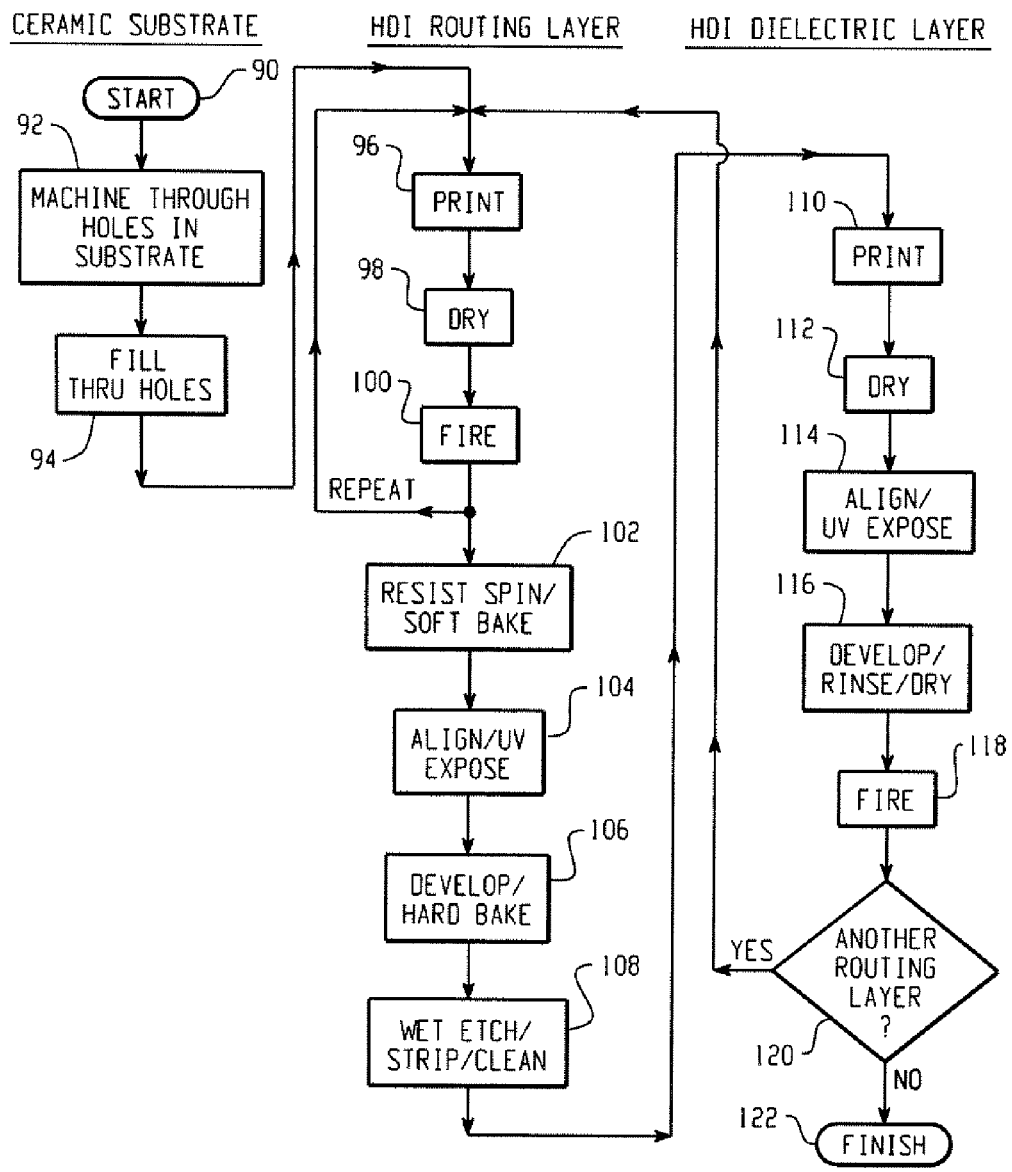
Figure 7:
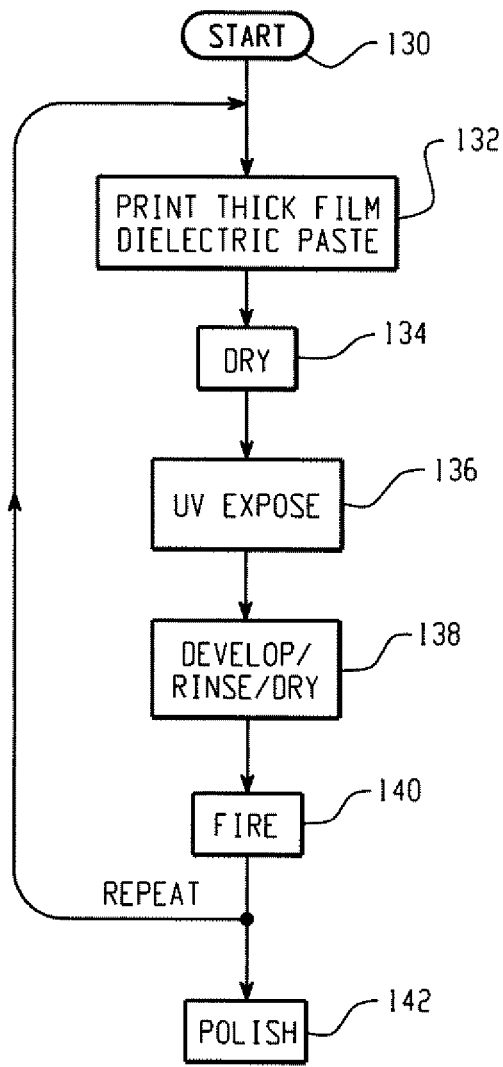
Figure 8:
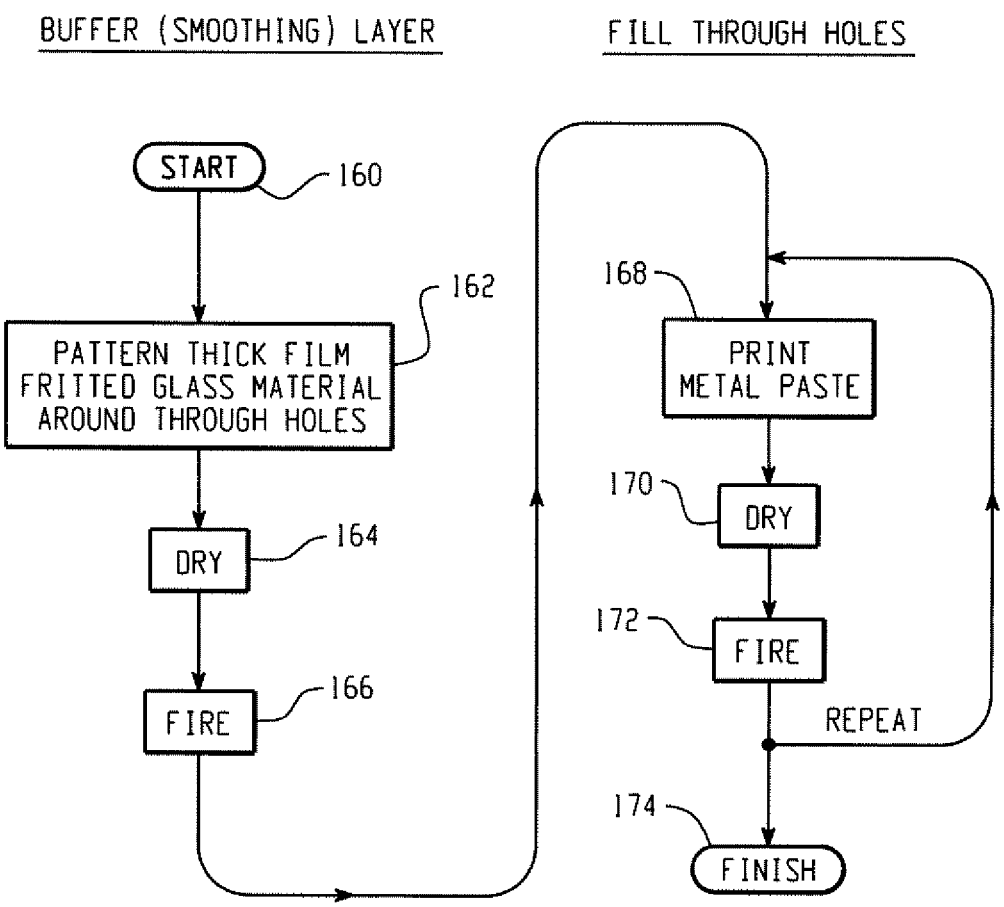

FIGS. 5-9 illustrate example processes for fabricating the circuit structure of FIG. 4. FIG. 5 is a flow diagram illustrating the overall fabrication process. FIG. 6 is a flow diagram illustrating an example process for fabricating the ceramic substrate and HDI routing and dielectric layers. FIG. 7 illustrates an example process for fabricating the buffer (smoothing) layer on top of photodefineable thick film dielectric material with high density conductive routing layers 56. FIG. 8 illustrates an example process for fabricating a patterned fritted glass smoothing layer FIGS. 9A and 9B are a flow diagram illustrating an example process for fabricating the thin film circuit, including the MLC structure.

With reference first to FIG. 5, the overall process for fabricating the example circuit structure of FIG. 4 is illustrated as a five step process. In the first step 80, the core HDI substrate is fabricated. This includes the fabrication of the ceramic substrate with the HDI routing and dielectric layers. In the second step 82, the buffer (smoothing) layer is fabricated on the HDI substrate. In the third step 83, an adhesion layer is fabricated on top of the buffer (smoothing) layer. In the fourth and fifth steps 84, 86, the thin film circuit is fabricated by building the MLC structure on top of the buffer layer and integrating the MLC with additional thin film circuit components, such as additional high frequency capacitors, inductors, thin film resistors and/or other passive components.

With reference now to FIG. 6, the example process for fabricating the ceramic substrate and HDI layers begins at step 90. At step 92, through holes are machined through the ceramic substrate material using a laser beam. In other examples, however, the through holes could be machined using other processes, such as a pneumatic abrasion, ultrasonic milling, green tape punching or other suitable method for machining high density through holes in ceramic. The through holes are then filled with metal at step 94. The process then proceeds to step 96 to fabricate the first HDI routing layer.

At step 96, a layer of conductive material (e.g., Au) is deposited on the ceramic substrate (e.g., by screen printing) to form the first routing layer. The routing layer is dried at step 98 and fired at step 100. Steps 96-100 may then be repeated to fabricate a thicker routing layer. Once a routing layer with the desired thickness has been deposited, the process proceeds to step 102 to pattern the routing layer.

At step 102, a photoresist material is deposited over the conductive material (e.g., by spinning) and is baked to cure the photoresist. A mask is then aligned over the photoresist layer and UV exposed at step 104 in order to pattern a negative image of the routing layout in the photoresist material. The patterned photoresist is developed and hard baked at step 106. The conductive material that is exposed through the photoresist is then wet etched at step 108 to pattern the routing layer, the photoresist is stripped, and the routing layer is cleaned. The process then proceeds to step 110 to deposit and pattern a dielectric layer over the routing layer.

A photosensitive (photodefineable) thick film dielectric material is deposited (e.g., by screen printing) over the HDI routing layer at step 110, and the deposited dielectric material is dried at step 112. A mask is then aligned over the photosensitive dielectric layer and UV exposed at step 114 in order to pattern vias for exposing select portions of the HDI routing layer. At step 116, the UV exposed dielectric is developed, rinsed and dried, forming through holes in the HDI dielectric layer. The structure is then fired at step 118. If another HDI routing layer is required, then the process returns to step 96. Else, the process ends at step 122.

In another example, a non-photosensitive thick film material could be used to form the HDI dielectric layers by UV exposing a photoresist material and etching the thick film material to form the through holes.

FIG. 7 illustrates an example process for fabricating the buffer (smoothing) layer using a thick film material. The process begins at step 130 after the core HDI substrate has been fabricated. At step 132 a photosensitive thick film dielectric paste is deposited (e.g., by screen printing) on top of the HDI layers. In other examples that do not include a HDI layer (e.g., FIG. 1), the thick film dielectric paste may be deposited directly on the ceramic substrate. The thick film paste is then dried (e.g., at 120.degree. C. for about 15 minutes) at step 134 to remove volative organic vehicles.

At step 136 the layer of thick film dielectric material is UV exposed. The photosensitive thick film is then developed, rinsed and dried at step 138. The thick film material is then hardened by firing (e.g., peak of 850° C. for about 10 minutes) at step 140. Steps 132-140 may then be repeated one or more times to achieve a desired thickness for the buffer layer. Once the thick film material has been fabricated to a desired thickness, the top surface of the buffer layer is polished to create a smooth surface. The surface of the buffer layer may, for example, be polished to have a final surface roughness (Ra) of about 0.06 to about 0.08 μm.

In another example, a non-photosensitive thick film material could be used by UV exposing a photoresist material and etching the thick film material to form the vias and/or through holes.

FIG. 8 illustrates an example process for fabricating the buffer (smoothing) layer using a fritted glass material. The process begins at step 160 after the core ceramic substrate containing HDI routing layers (or without HDI routing layers) has been fabricated. At step 162 a thick film glass material with organic binders is patterned (e.g., by screen printing) on the HDI layers, leaving the non-filled through holes exposed. The fritted glass material may, for example, be deposited to a thickness of about 20 μm to about 25 μm. The fritted glass material is then dried to remove volative organic binders at step 164 and is fired (e.g., peak of 1250° C.) at step 166. Steps 162-166 may be repeated, as needed, in order to provide a smoother surface.

After firing, the formed glass buffer layer provides a smooth surface for fabricating the MLC or other thin film passives.

After the buffer layer has been fabricated, the process proceeds to step 168 to fill the through holes. At step 168, a metal paste (e.g., Ni) is deposited in the through holes. The metal paste is then dried at step 170 and fired at step 172. The metal paste should be fired at a temperature lower than the glass buffer layer firing temperature (e.g. about 1000 to about 1100° C.). Steps 168-172 may then be repeated to ensure that the through holes are completely filled. Once the through holes in the buffer layer have been filled with metal, the process ends at step 174.

Figure 9A:
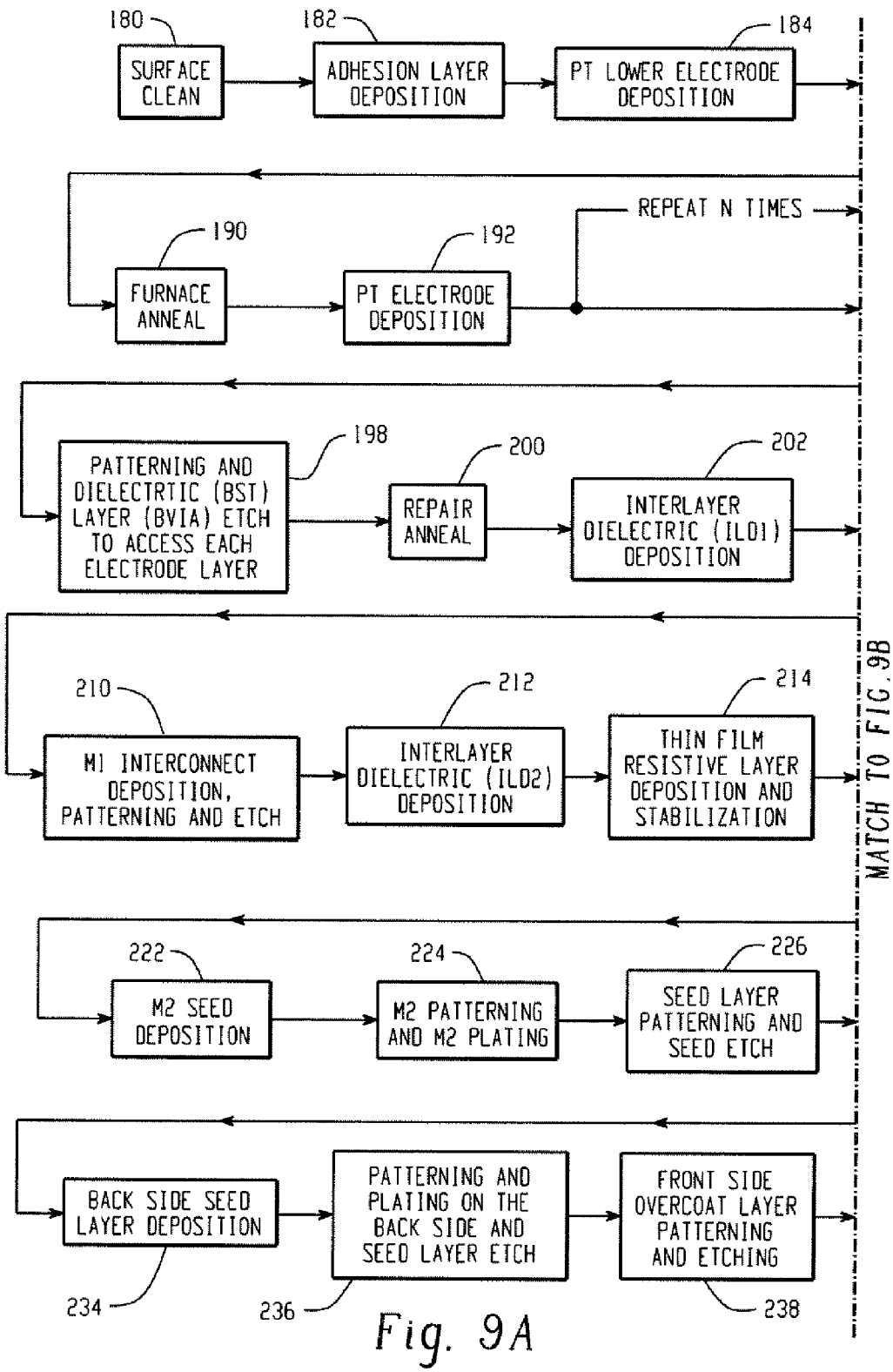
Figure 9B:
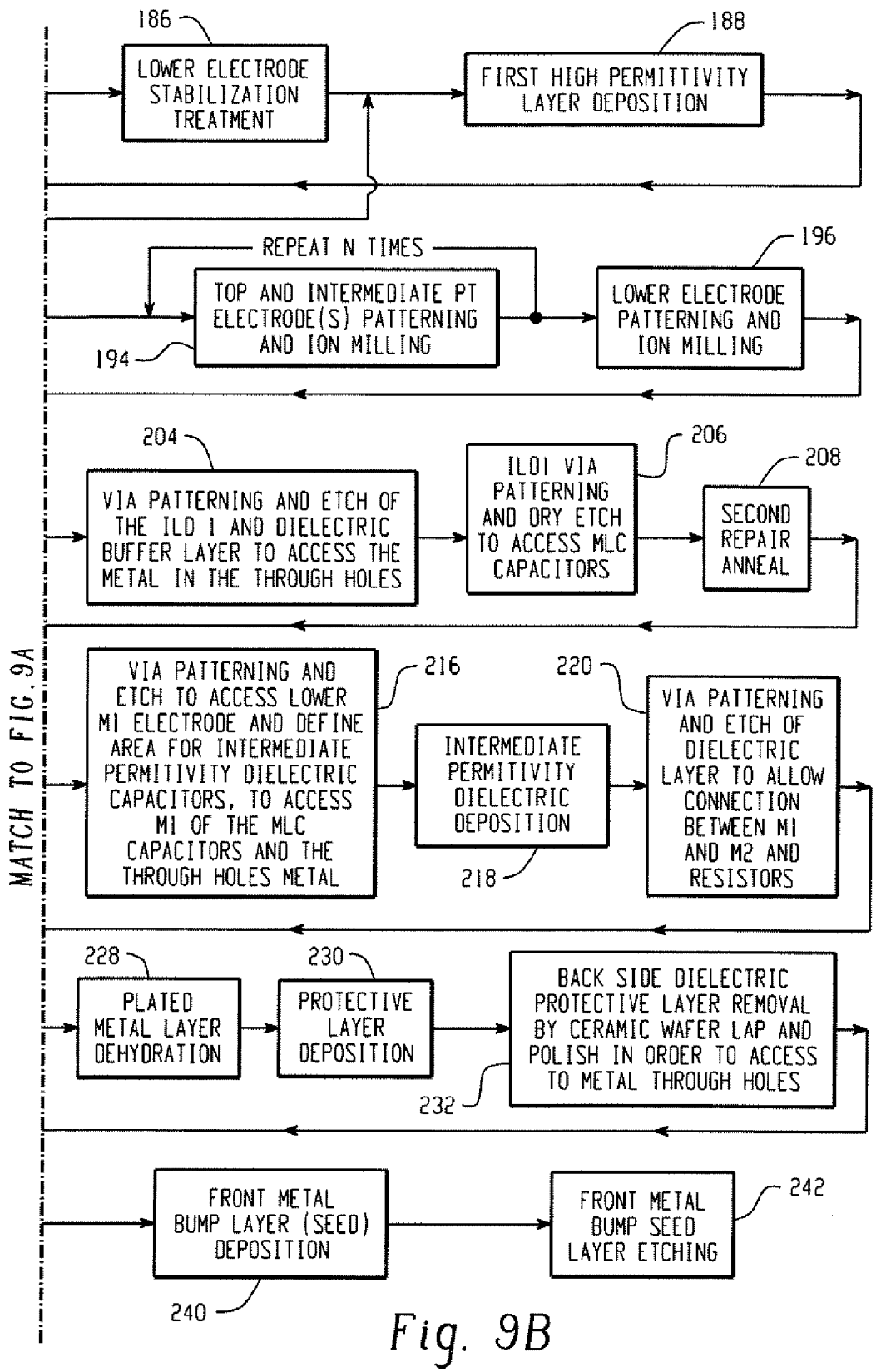

With reference to FIGS. 9A and 9B, the example process for fabricating the thin film circuit begins by cleaning the surface of the buffer (smoothing) layer at step 180. At step 182 an adhesion layer (e.g., TiOx) is deposited over the buffer (smoothing) layer. The first electrode layer (e.g., Pt) of the MLC structure is then deposited over the adhesion layer at step 184 and the structure is annealed to stabilize the electrode layer at step 186. A high or low permittivity dielectric layer is then deposited over the first electrode layer at step 188. The dielectric layer may, for example, be deposited by chemical solution deposition, physical vapor deposition, chemical vapor deposition or by other suitable means. In the case of a tunable capacitor, a high permittivity dielectric layer 62 is used (e.g., BST material). The dielectric layer is then annealed at step 190, and a second electrode layer is deposited over the dielectric at step 192 forming a parallel plate capacitor. Steps 188-192 may then be repeated to created additional capacitor layers.

At steps 194 and 196, the layers of electrode and dielectric materials are patterned and ion milled to form a mesa-structure, as illustrated in FIG. 4. Selected exposed dielectric layers are then patterned and etched at step 198 to create vias exposing the underlying electrode layers. Any damage to the dielectric layers caused by the etching step 198 is then repaired by annealing at step 200.

At step 202 a first interlayer dielectric (ILD1) is deposited over the MLC and buffer (smoothing) layers. The interlayer dielectric may, for example, be a PSG material. Through holes (vias) are then patterned and etched through the interlayer dielectric at steps 204 and 206 to expose the vias in the buffer layer and MLC. At step 208 the structure is annealed to repair any damage to the high permittivity dielectric layers of the MLC structure caused by the etching steps. Then, at step 210 a metallic material, such as TiW/Al/TiW, TiW/Al, TiW/Pt/Au or TiW/Cu, is deposited, patterned and etched to provide an interconnect (M1) to the MLC and HDI routing layers via the contact holes.

At step 212 a second interlayer dielectric (ILD2) is deposited over the first interlayer dielectric (ILD1) and the interconnect layer (M1). The second interlayer dielectric may, for example, be a PSG material. Then, at step 214 a thin film resistive layer is deposited on the ILD2. Other thin film components may also be patterned on the ILD2 at this stage in the process. Then, at step 216 vias are patterned and etched through the ILD2 to access the interconnect layer (M1).

At step 218 an intermediate permitivity dielectric material is deposited in the through holes of the ILD2 layer to provide a dielectric layer for one or more low/intermediate permittivity dielectric capacitors (e.g., $Si_3N_4$, etc.). The dielectric material is then patterned and etched at step 220 to provide connections to the interconnect layer (M1) where needed. At step 222, a metallic material, such as TiW/Au or TiW/Cu, is deposited on the ILD2 layer and in the vias of the ILD2 layer to provide an interconnect (M2) to the filled contact holes in the first ILD layer (ILD1), and also to create low/intermediate permittivity dielectric capacitors (C1). The interconnect layer (M2) is then patterned and plated at step 224 to create interconnects and connections to the thin film components above the ILD2 layer. High frequency inductors may also be formed and interconnected at this stage in the process. Then, a seed layer is patterned and etched at step 226 and the final plated metal layer is dehydrated at step 228. The metal interconnects (M2) may then be covered with a protective layer, such as a $Si_3N_4$ overcoat, at step 230.

At step 232, any protective layer on the back side of the ceramic substrate is removed and the back side of the ceramic wafer is polished to access the metal filled through holes. A conductive seed layer is then deposited, patterned, plated and etched on the back side of the ceramic substrate at steps 234 and 236 to form bonding pads. The bonding pads may, for example, be fabricated using a TiW/Cu seed layer and a Cu plating.

At step 238, the protective overcoat on the top layer of the structure is patterned and etched to expose select portions of the interconnect layer (M2). A metal bump layer (e.g., TiW/Au) may then be deposited and etched at steps 240 and 242 to form bonding pads on the top surface of the structure. The top layer bonding pads may, for example, be used to connect with the bonding pads of an integrated circuit, forming a SoP structure.

This written description uses examples to disclose the invention, including the best mode, and also to enable a person skilled in the art to make and use the invention. It should be understood that the examples depicted in the Figures may not be drawn to scale. The patentable scope of the invention may include other examples that occur to those skilled in the art.

What is claimed is:

1. A method, comprising:
   smoothing a surface of a dielectric buffer layer;
   forming multiple layers of a thin film multi-level capacitor over the dielectric buffer layer, the forming of the multiple layers including providing high permittivity dielectric layers interleaved between electrode layers to form multiple capacitors stacked on each other, wherein pairs of the multiple capacitors share a common electrode therebetween, and wherein a bottom electrode of a bottom capacitor of the multiple capacitors is formed directly on the dielectric buffer layer;
   annealing each capacitor layer before forming a successive capacitor layer;
   forming a high density interconnect layer, wherein the dielectric buffer layer provides electrical isolation between the high density interconnect layer and the thin film multi-level capacitor; and
   forming a contact via through the dielectric buffer layer and the high density interconnect layer to provide electrical contact for the thin film multi-level capacitor.

2. The method of claim 1, wherein the smoothing of the surface is to a surface roughness (Ra) of less than or equal to 0.08 microns and substantially free of surface micropores.

3. The method of claim 1, comprising performing a heat treatment after each electrode layer of the multi-level capacitor is formed, wherein the multiple capacitors are formed in a mesa structure.

4. The method of claim 1, comprising performing a heat treatment after each electrode layer of the multi-level capacitor is formed, wherein a surface roughness (Ra) of the buffer layer after the smoothing is less than or equal to 0.06 micrometers (um) and wherein the multiple layers of the thin film multi-level capacitor are each single layers of a barium strontium titanium oxide dielectric material.

5. The method of claim 1, wherein the multiple layers of the thin film multi-level capacitor are each single layers of a barium strontium titanium oxide dielectric material.

6. The method of claim 1, further comprising:
   depositing an interlayer dielectric layer over the dielectric buffer layer;
   fabricating an additional passive thin film device on the interlayer dielectric layer; and
   depositing an interconnect layer to electrically couple the additional passive thin film device to the thin-film multi-level capacitor.

7. The method of claim 1, wherein the high permittivity dielectric layers comprise Barium Strontium Titanium Oxide forming a tunable capacitor, and wherein a first capacitor of the multiple capacitors has different capacitance-voltage characteristics than a second capacitor of the multiple capacitors.

8. The method of claim 1, further comprising depositing the dielectric buffer layer on a ceramic substrate comprising one of AlN, $Mg_2SiO_4$ or $MgTiO_3$.

9. The method of claim 1, wherein a first capacitor of the multiple capacitors is a voltage tunable capacitor, and wherein a second capacitor of the multiple capacitors is a fixed value capacitor.

10. The method of claim 9, wherein the multiple capacitors are in a mesa structure.

11. The method of claim 1, wherein the thin film multi-level capacitor has an overall capacitance density of about 10 $fF/um^2$ to about 390 $fF/um^2$.

12. A method, comprising:
    smoothing a surface of a glass dielectric buffer layer;
    forming multiple layers of a thin film multi-level capacitor over the glass dielectric buffer layer, the forming of the multiple capacitor layers including providing high permittivity dielectric layers interleaved between electrode layers to form multiple capacitors stacked on each other, wherein pairs of the multiple capacitors share a common electrode therebetween, wherein at least one capacitor of the multiple capacitors is a voltage tunable capacitor;
    annealing each capacitor layer before forming a successive capacitor layer; and
    forming a high density interconnect layer, wherein the glass dielectric buffer layer provides electrical isolation between the high density interconnect layer and the thin film multi-level capacitor.

13. The method of claim 12, wherein at least one second capacitor of the multiple capacitors is a fixed value capacitor.

14. The method of claim 12, wherein at least one of the multiple layers of the thin film multi-level capacitor comprises a barium strontium titanium oxide dielectric material.

15. The method of claim 12, comprising:
    forming a contact via through the glass dielectric buffer layer and the high density interconnect layer to provide electrical contact between the thin film multi-level capacitor and a bonding pad formed on an underside of a substrate; and
    performing a heat treatment after each electrode layer of the multi-level capacitor is formed, wherein the glass dielectric buffer layer surface is smoothed to a Ra roughness of less than or equal to 0.08 microns, wherein a bottom electrode of a bottom capacitor of the multiple capacitors is formed directly on the glass dielectric buffer layer, and wherein the multiple layers of the thin film multi-level capacitor are each single layers of a dielectric material.

16. A method, comprising:
- smoothing a surface of a dielectric buffer layer;
- forming multiple layers of a thin film multi-level capacitor over the dielectric buffer layer, the forming of the multiple layers including providing high permittivity dielectric layers directly interleaved between electrode layers to form multiple capacitors stacked on each other, wherein pairs of the multiple capacitors share a common electrode therebetween, wherein at least a first capacitor of the multiple capacitors is a tunable capacitor comprising barium strontium titanate; and
- forming a high density interconnect layer, wherein the dielectric buffer layer provides electrical isolation between the high density interconnect layer and the thin-film multi-level capacitor.

17. The method of claim 16, comprising:
- forming a contact via through the dielectric buffer layer and the high density interconnect layer to provide electrical contact between the thin film multi-level capacitor and a bonding pad formed on an underside of a substrate; and
- performing a heat treatment after each electrode layer of the multi-level capacitor is formed, wherein the dielectric buffer layer surface is smoothed to a Ra roughness of less than or equal to 0.08 microns.

18. The method of claim 16, wherein a first capacitor of the multiple capacitors has different capacitance-voltage characteristics than a second capacitor of the multiple capacitors.

19. The method of claim 16, comprising forming a protective coating on an underside of a substrate, wherein the multiple capacitors are formed in a mesa structure.

* * * * *